United States Patent
Mukaihara et al.

(10) Patent No.: US 6,737,290 B2
(45) Date of Patent: May 18, 2004

(54) SURFACE-EMITTING SEMICONDUCTOR LASER DEVICE AND METHOD FOR FABRICATING THE SAME, AND SURFACE-EMITTING SEMICONDUCTOR LASER ARRAY EMPLOYING THE LASER DEVICE

(75) Inventors: Toshikazu Mukaihara, Tokyo (JP); Noriyuki Yokouchi, Tokyo (JP); Akihiko Kasukawa, Tokyo (JP)

(73) Assignee: The Furukawa Electric Co., LTD, Tokyo (JP)

( * ) Notice: Subject to any disclaimer, the term of this patent is extended or adjusted under 35 U.S.C. 154(b) by 0 days.

(21) Appl. No.: 10/223,190

(22) Filed: Aug. 16, 2002

(65) Prior Publication Data

US 2002/0197756 A1 Dec. 26, 2002

Related U.S. Application Data

(63) Continuation of application No. PCT/JP00/08998, filed on Dec. 19, 2000.

(51) Int. Cl.[7] ................................................. H01L 21/00
(52) U.S. Cl. ............................. 438/30; 438/39; 257/98; 257/79; 257/99; 257/103; 372/46; 372/45; 372/96; 372/36; 372/50; 372/49
(58) Field of Search ....................... 438/30, 39; 257/98, 257/79, 99, 103; 372/46, 45, 96, 36, 50, 49

(56) References Cited

U.S. PATENT DOCUMENTS

| | | | | |
|---|---|---|---|---|
| 5,212,702 A | * | 5/1993 | Choquette | 372/45 |
| 5,316,968 A | * | 5/1994 | Choquette | 438/39 |
| 5,544,189 A | * | 8/1996 | Fukushima | 372/46 |
| 6,370,179 B1 | * | 4/2002 | Deppe et al. | 372/96 |
| 6,376,833 B2 | * | 4/2002 | Shimada et al. | 250/234 |
| 6,469,324 B1 | * | 10/2002 | Wang | 257/98 |
| 6,507,594 B1 | * | 1/2003 | Furukawa et al. | 372/36 |
| 6,549,556 B1 | * | 4/2003 | Hwang et al. | 372/96 |
| 2002/0071464 A1 | * | 6/2002 | Coldren et al. | 372/45 |
| 2003/0156613 A1 | * | 8/2003 | Uenohara et al. | 372/46 |

FOREIGN PATENT DOCUMENTS

| | | |
|---|---|---|
| JP | 05-235464 | 9/1993 |
| JP | 10-173278 | 6/1998 |
| JP | 11-074609 | 3/1999 |
| JP | 11-312847 | 11/1999 |
| JP | 2000-307189 | 2/2000 |
| WO | WO 02/50968 A1 | 6/2002 |

* cited by examiner

*Primary Examiner*—Matthew Smith
*Assistant Examiner*—V. Yevsikov
(74) *Attorney, Agent, or Firm*—Oblon, Spivak, McClelland, Maier & Neustadt, P.C.

(57) ABSTRACT

A surface-emitting semiconductor laser device having reduced device resistance, a method for fabricating the device and a surface-emitting semiconductor laser array employing the device are provided. The laser device comprises a lower reflector layer structure and an upper reflector layer structure, formed on a p-type semiconductor substrate. An etching blocking layer, a current confinement layer, and an active layer are formed in that order from below between the lower and upper reflector layer structures. The portion over the etching blocking layer is formed into a mesa shape.

3 Claims, 3 Drawing Sheets

US 6,737,290 B2

SURFACE-EMITTING SEMICONDUCTOR LASER DEVICE AND METHOD FOR FABRICATING THE SAME, AND SURFACE-EMITTING SEMICONDUCTOR LASER ARRAY EMPLOYING THE LASER DEVICE

This is a continuation of Application No. PCT/JP00/08998, filed Dec. 19, 2000.

TECHNICAL FIELD

The present invention relates to a surface emitting semiconductor laser device, a method for fabricating the same, and a surface-emitting semiconductor laser array that employs the laser devices.

BACKGROUND ART

A surface-emitting laser (device) that emits laser light in the direction normal to the plane of the substrate can be easily coupled to an optical fiber because of the circular shape of the emitted light beam. In addition, the surface-emitting laser can have an optical resonator which is short in length and which emits single mode light. Thus, the surface-emitting laser has lately received attention as a light source for use in data communications (optical interconnections) or optical computers, which employ optical fibers.

Furthermore, the surface-emitting laser device having a small region of lasing, i.e., an active layer, can be operated at a low threshold current (for example, on the order of several milliamperes). Furthermore, it is expected that an array of a large number of these laser devices will be applied as a highly integrated device.

An example of such a surface-emitting laser device is shown in FIG. 1.

The laser device comprises the following layers grown on a p-type GaAs semiconductor substrate 100 in the order mentioned below. That is, grown are a lower reflector layer structure 110 of a p-type AlGaAs multilayer film, a current confinement layer 120, a quantum-well-structured active layer 140 of GaAs/AlGaAs, and an upper reflector layer structure 150 of an n-type AlGaAs multilayer film. The upper portion from the upper reflector layer structure 150 to the lower surface of the current confinement layer 120 (the interface between the current confinement layer 120 and the lower reflector layer structure 110) is formed into a cylindrical mesa structure (of diameter 20 μm) 200. On the upper end surface of the mesa structure, an n-type electrode 160 is so formed by evaporation as to cover the mesa structure 200. On the other hand, there is formed a p-type electrode 180 on the rear surface of the substrate 100. Incidentally, a silicon nitride film 190 is grown to passivate the surface of the device except for the upper end surface of the mesa structure, that is, the side of the mesa structure and the upper surface of the upper reflector layer structure.

To form the mesa structure 200, dry etching such as reactive ion beam etching (RIBE) is performed on the entire layer structure after the aforementioned layers have been grown on the substrate 100.

The current confinement layer 120 located between the lower reflector layer structure 110 and the active layer 140 is formed as follows: A precursor layer is first formed of, e.g., AlAs and then a mesa structure including the precursor layer is formed. Thereafter, the mesa structure is heated (for example, at 400° C. for ten minutes) in a water vapor atmosphere. Thereby, the precursor layer is oxidized from the side portion toward the core portion thereof, to form an insulating layer 120a and allow a non-oxidized electrically conductive layer 120b of AlAs to remain on the core portion. In this case, injected current is concentrated to the electrically conductive layer 120b of the current confinement layer 120, thereby making it possible to reduce the threshold current of the device.

Incidentally, to form the current confinement layer 120 from the precursor layer in a stable state, it is necessary to allow the precursor layer to be positively included within the mesa structure and perform sufficient oxidation from the side portion. However, in a case where dry etching such as RIBE having directionality is employed to form the precursor layer in the mesa structure, instability of the dry etching causes the depth of an actual etching to be varied by approximately ±10%.

Therefore, to etch the whole layer structure in consideration of such a variation with the precursor layer being positively included therein, it is necessary to set the endpoint of the etching to a position deeper by 10% or more than the actual position of the precursor layer. For example, in a case where the precursor layer is present at a depth five μm from the surface of the whole layer structure, the endpoint of the etching can be set to a position 5.5 μm from the surface to provide an actual etching depth of approximately 5 to 6 micrometers. Thus, in any case, it is possible to form the mesa structure with the precursor layer being positively included therein.

However, with this method, if the depth of an actual etching is shifted to be larger than the value of the endpoint that has been set, the portion under the precursor layer is to be etched. For example, in the aforementioned example, the whole layer structure may be etched to a depth one μm deeper at maximum than the position of the precursor layer as shown by the dashed line in FIG. 1. Thereby, part or all of the lower reflector layer structure 110 of p-type may be formed into a mesa structure.

Japanese Patent Laid-Open Publication No. Hei 5-235464 disclosed the following fact. As the cross-sectional area of a p-type GaAs/AlAs mirror layer (reflector structure) of a laser device decreases, a spike or difference in valence bands at the heterojunction of GaAs/AlAs tends to limit the electrical conduction of holes, thereby causing an increase in resistance of the device. Therefore, the surface-emitting semiconductor laser device employing a p-type semiconductor substrate presents a problem such that a p-type reflector layer structure on the substrate is etched into a mesa structure having a reduced cross-sectional area, and thus the device has a higher resistance than that of a device having the reflector layer structure being not etched, resulting in an increase in the heat generation and operating voltage of the device. Furthermore, a variation in depth of etching causes the resulting device to be varied in property.

An object of the present invention is to solve the aforementioned problems of the surface-emitting semiconductor laser device by providing a surface-emitting semiconductor laser device, a method for fabricating the device and a surface-emitting semiconductor laser array employing the device, in which the lower reflector layer structure is prevented from being etched by an etching blocking layer provided between the current confinement layer and the lower reflector layer structure and the resistance of the device is reduced.

DISCLOSURE OF THE INVENTION

To achieve the aforementioned object, the present invention provides a surface-emitting semiconductor laser device comprising a lower reflector layer structure and an upper reflector layer structure, formed on a p-type semiconductor substrate. The device also comprises an etching blocking layer, a current confinement layer, and an active layer, formed in that order from below between said lower reflector layer structure and said upper reflector layer structure. In the device, a portion over said etching blocking layer is formed into a mesa shape.

In addition, the present invention provides a method for fabricating the surface-emitting semiconductor laser device comprising the steps of forming a lower reflector layer structure, an etching blocking layer, a precursor layer of a current confinement layer, and an upper reflector layer structure, on a p-type semiconductor substrate in that order; performing dry etching from the upper reflector layer structure downwards to form a general shape of a mesa structure over the etching blocking layer; performing wet etching up to an upper surface of the etching blocking layer to form a shape of the mesa structure on the upper surface of the etching blocking layer; and oxidizing a side portion of the precursor layer of the current confinement layer included within the mesa structure, to form the current confinement layer. Furthermore, the present invention provides a surface-emitting semiconductor laser array comprising a plurality of layer structures each including from said lower reflector layer structure to said upper reflector layer structure of the above-mentioned surface-emitting semiconductor laser device, wherein the plurality of layer structures are integrated on a p-type semiconductor substrate that is common among them.

BEST MODE FOR CARRYING OUT THE INVENTION

The technical principle of the present invention is to provide a device with reduced resistance. This is accomplished by providing an etching blocking layer between the current confinement layer and the lower reflector layer structure, thereby preventing the (p-type) reflector layer structure located under the etching blocking layer from being etched to be formed into part of the mesa structure.

The present invention pays attention to the difference in feature between dry and wet etching. Dry etching that provides good etching accuracy is first applied to the formation of the entire layer structure, thereby etching the portion located over the etching blocking layer to form a general shape of the mesa structure with good accuracy. Then, wet etching that provides high etching selectivity is applied to the aforementioned general shape, thus selectively etching the layer structure remaining on the etching blocking layer to form the portion up to the upper surface of the etching blocking layer into the mesa structure of an intended shape with accuracy.

Now, an example of a surface-emitting laser device according to the present invention will be explained with reference to FIG. 2.

Figure 1:
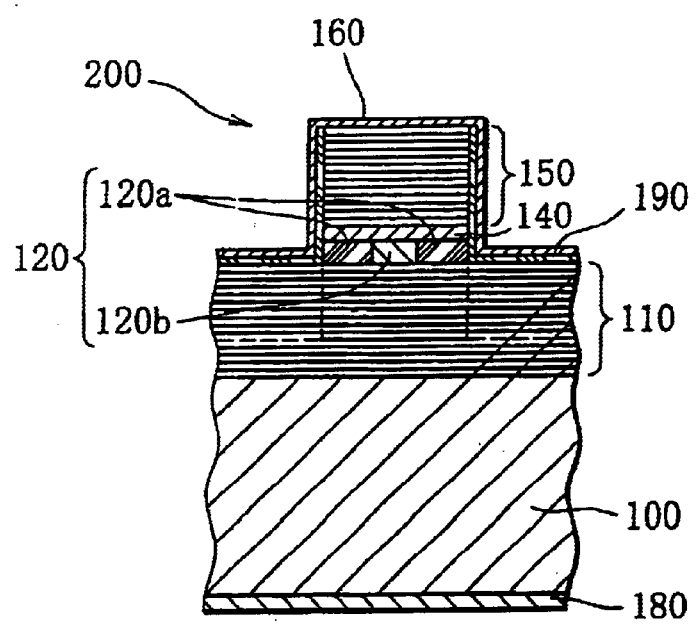
FIG. 1 is a cross-sectional view illustrating the layer structure of a conventional surface-emitting semiconductor laser device.
Figure 2:
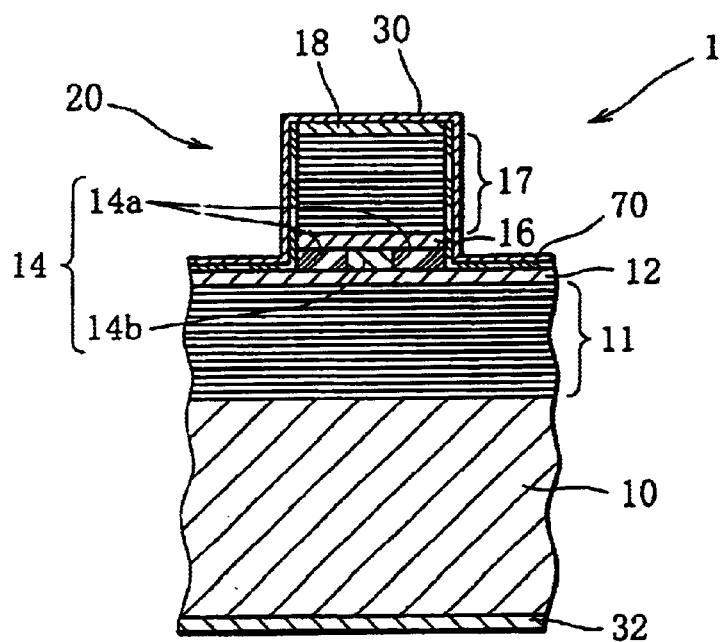
FIG. 2 is a cross-sectional view illustrating the layer structure of a surface-emitting semiconductor laser device according to the present invention.

Referring to FIG. 2, a surface-emitting laser device 1 has the following structure grown on a p-type semiconductor substrate 10 of p-type GaAs. That is, the structure includes a lower DBR mirror (a lower reflector layer structure) 11 of thirty pairs of a p-type $Al_{0.2}Ga_{0.8}As$ layer and a p-type $Al_{0.9}Ga_{0.1}As$ layer. The structure also includes an upper DBR mirror (an upper reflector layer structure) 17 of twenty-five pairs of an n-type $Al_{0.2}Ga_{0.8}As$ layer and an n-type $Al_{0.9}Ga_{0.1}As$ layer. In addition, between the DBR mirrors 11 and 17, arranged are from below in sequence an etching blocking layer 12 of InGaP, a current confinement layer 14, and a GaAs/AlGaAs active layer 16 having three quantum well structures, these layers forming a semiconductor layer structure as a whole. Incidentally, in this embodiment, there is formed a cap layer 18 of n-type GaAs on the upper DBR mirror 17.

Furthermore, the portion from the cap layer 18 down to the lower end surface of the current confinement layer 14 (the interface between the current confinement layer 14 and the etching blocking layer 12) is formed into a cylindrical mesa structure 20 (having 30 μm diameter and 3.5 μm height). On the upper end surface and side surface of the mesa structure, an n-type Ti/Pt/Au electrode 30 is so formed by evaporation as to cover the whole mesa structure 20. On the other hand, there is formed a p-type AuZn electrode 32 on the rear surface of the p-type substrate 10. Incidentally, a silicon nitride film 70 is grown to passivate the whole surface of the surface-emitting laser device 1.

The lower reflector layer structure 11 and the upper reflector layer structure 17 are laser reflecting mirrors to constitute a resonator and can be formed by alternately growing two types of semiconductor films of different compositions (for example, the AlGaAs layers) as described above. In this case, it is preferable to provide each of the semiconductor films with an optical thickness of λ/4 (where λ is the wavelength of emitted laser light).

Furthermore, it is preferable to form the reflector layer structures 11, 17 of an n-type or a p-type semiconductor according to the polarity of the laser device. Thus, the lower reflector layer structure 11 is preferably formed of a p-type semiconductor and the upper reflector layer structure 17 is preferably formed of an n-type semiconductor. Incidentally, it is preferable to reduce the ratio of composition of Al in the semiconductor films of AlGaAs so that each of the reflector layer structures 11, 17 can be prevented from being oxidized upon formation of the current confinement layer 14, described later. Furthermore, instead of the multilayer film of the aforementioned semiconductors, the reflector layer structures may be formed of a dielectric multilayer film or a metallic thin film.

The etching blocking layer 12 is formed of a material, which is lattice mismatched 0.5% or less to semiconductor layers to be etched, and more particularly of a material which is not etched by wet etching, described later. For example, such materials include InGaP for a case where the entire layer structure is formed of GaAs-based semiconductor. When the layer structure that includes the etching blocking layer is wet etched, only the layer structure located over the etching blocking layer is selectively etched. The etching blocking layer is prevented from being etched, so that etching is blocked at the upper surface of the etching blocking layer. In this case, the portion under the etching blocking layer, or the lower reflector layer structure, is never etched.

The current confinement layer 14 has a concentric annular structure in which the core portion is formed of a conductive layer 14b of about 10 μm diameter and the outer circumference portion is formed of an insulating layer 14a. Injected current is concentrated to the electrically conductive layer 14 and the threshold current is thereby reduced.

The current confinement layer 14 is formed in the following steps. First, a precursor layer is formed using an Al-doped compound semiconductor upon formation of the aforementioned layer structure and then etching is performed to form the mesa structure. Thereafter, oxidation is performed from the side portion of the precursor layer toward the core portion to thereby convert the rim portion into the insulating layer 14a of aluminum oxide. The non-oxidized Al-doped compound semiconductor is allowed to remain on the core portion as the conductive layer 14b. For example, AlAs or AlGaAs can be employed as the Al-doped compound semiconductor. Incidentally, this embodiment employs p-type AlAs as the material of the precursor layer.

The active layer 16 provides for lasing by the recombination of electrons and holes. In particular, a quantum-well-structured active layer is preferable in that it provides for a more reduced threshold. Incidentally, the active layer 16 may be sandwiched as appropriate with cladding layers which have a bandgap higher than and a refractive index lower than the active layer 16 and are formed over and under the active layer 16, respectively, thereby confining electrons and light within the active layer. For example, as the material of the active layer 16 (and the cladding layers), a GaAs semiconductor can be employed. In addition, to form the cladding layers, the cladding layers may be doped with a small quantity of Al, for example, so that it has a bandgap higher than that of the active layer.

The cap layer 18 realizes an ohmic contact with the n-type electrode to be formed on top thereof and is formed of a material for reducing the contact resistance between the both. For example, the cap layer 18 can be formed of a GaAs semiconductor doped with an n-type dopant such as Si, Ge, Sn, and Se.

The n-type electrode 30 can be formed, for example, of a multilayer film such as of Ti/Pt/Au. The p-type electrode 32 can be formed, for example, of AuZn or Ti/Pt/Au by evaporation.

For example, the molecular beam epitaxy (MBE) or the metal-organic chemical vapor deposition (MOCVD) maybe employed to form each semiconductor layer of the layer structure.

As described above, because of the action of the etching blocking layer 12, the surface-emitting laser device 1 does not allow the lower reflector layer structure 11, located below the etching blocking layer 12, to be etched and formed into part of the mesa structure. This prevents the p-type lower reflector layer structure 11 from being reduced in the cross-sectional area and the resistance of the device from being increased, thereby preventing an increase in the heat generation and in operating voltage of the device. The lower reflector layer structure 11 can be made larger in the cross-sectional area to thereby significantly reduce the resistance of the device. Furthermore, it is possible to positively etch and include, within the mesa structure, the precursor layer 14, which is located over the etching blocking layer 12. Moreover, the subsequent oxidation can easily convert the precursor layer into the current confinement layer, thereby making it possible to provide a lower threshold laser device.

For example, the surface-emitting laser device 1 according to the embodiment of FIG. 2 has a device resistance as low as 30 Ω and can emit laser light in the region of 850 nm at a low threshold (3 mA) and low operating voltage (2V at a drive current of 20 mA).

Now, a method for fabricating the surface-emitting laser device 1 will be explained.

Figure 3:
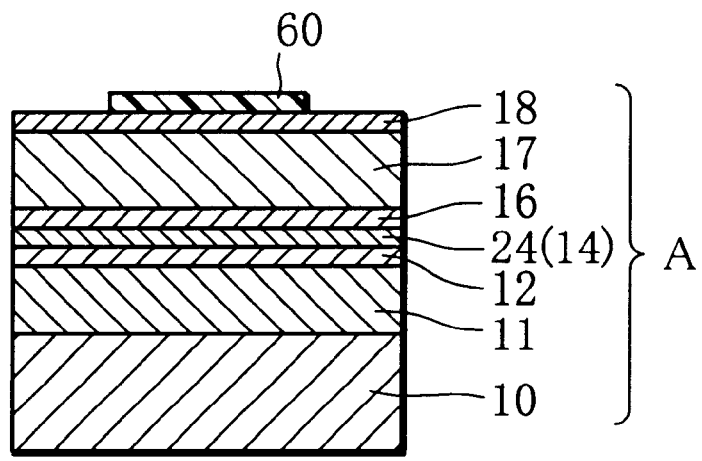
FIG. 3 is a cross-sectional view illustrating a layer structure A before being etched.

First, as shown in FIG. 3, the following layers are formed, for example, by MBE on the p-type semiconductor substrate 10 of p-type GaAs. That is, the lower reflector layer structure 11, the etching blocking layer 12, the precursor layer 24 of the current confinement layer, the active layer 16, the upper reflector layer structure 17, and the cap layer 18 are grown in sequence to form a layer structure A. Then, photo-resist is applied onto the uppermost layer of the layer structure A or the cap layer 18 to form, for example, by photolithography, a resist pattern 60 having the same cross-sectional shape as that of the mesa structure.

Figure 4:
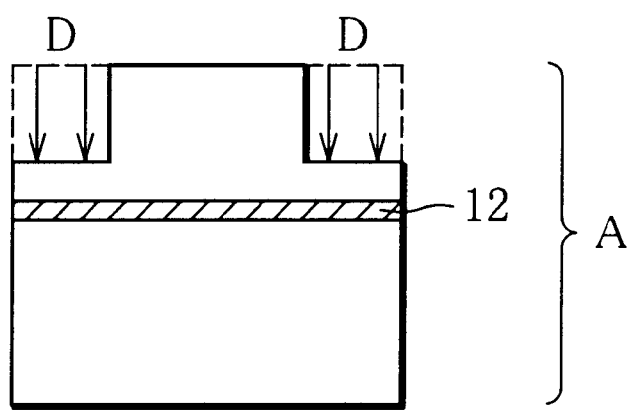
FIG. 4 is a cross-sectional view illustrating the layer structure A after having been dry etched.

Then, as shown in FIG. 4, dry etching D having directionality such as RIBE is applied to the layer structure A to form a general shape of the mesa structure. That is, part of the layer structure located over the etching blocking layer 12 is removed by etching. The part of the layer structure located over the etching blocking layer 12 can be any portion so long as it is located over the etching blocking layer 12. However, the portion has to be located so that the etching blocking layer 12 is not etched even when the dry etching D provides variable depths of etching. For example, take the case where the etching blocking layer is located at a depth of 5 μm from the surface of the layer structure A and the endpoint of the etching is set to an upper portion about 1 μm above the etching blocking layer. In this case, the etching blocking layer 12 will never be etched since the etching depth is about 4.5 (5−1+0.5) μm at maximum. Incidentally, the endpoint of the dry etching may be determined in accordance with the measured depths of etching, for instance.

Figure 5:
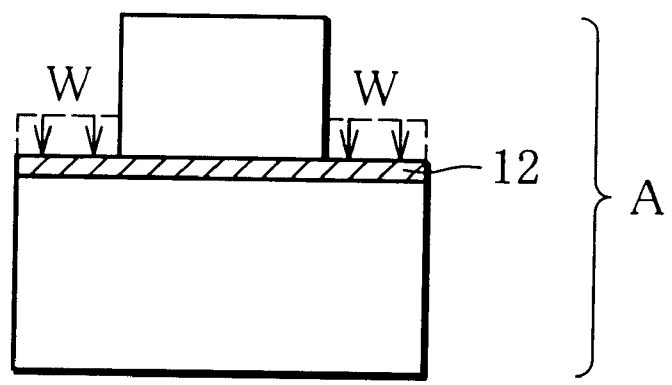
FIG. 5 is a cross-sectional view illustrating the layer structure A after having been wet etched.

Then, as shown in FIG. 5, wet etching W is applied to the surface exposed by the dry etching D. The portion from the surface exposed by the dry etching D down to the upper surface of the etching blocking layer 12 (the portion shown by the dashed lines in the figure) is thereby removed to complete the mesa structure. In this case, since the etching blocking layer 12 is formed of a material that cannot be etched by the wet etching W, the etching is automatically stopped at the upper surface of the etching blocking layer 12 without strict control of the endpoint. As an etchant used for the wet etching W like this, for example, an aqueous solution of sulfuric acid or phosphoric acid can be used.

Incidentally, this embodiment employs the mesa structure that is formed in the shape of a cylinder but the shape of the mesa structure is not limited thereto. For example, the mesa structure may be formed in the shape of a rectangular pole or a polygonal one.

Figure 6:
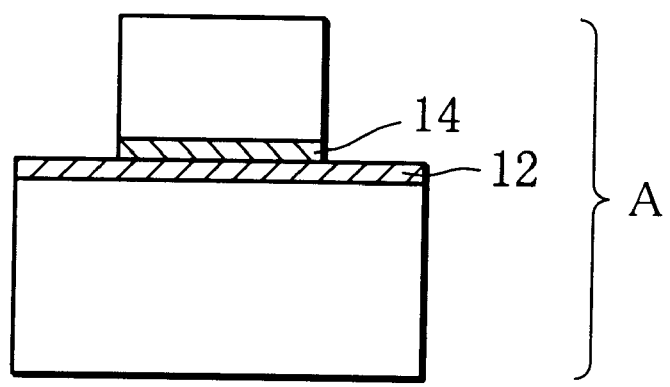
FIG. 6 is a cross-sectional view illustrating a mesa structure after having been oxidized.

Subsequently, oxidation is performed on the layer structure A that positively includes at least the precursor layer 24 within the mesa structure. Thereby, the precursor layer 24 is oxidized from the side thereof to be converted into the current confinement layer 14 (FIG. 6). For example, the aforementioned steam oxidation is preferably performed. The dew point, temperature, and application time of the water vapor can be varied to change the rate and level of the oxidation. For example, the water vapor oxidation, i.e., steam oxidation, may be carried out at 400° C. for ten minutes.

Then, passivation is performed on the whole surface of the resulting layer structure A with the silicon nitride film 70. Thereafter, dry etching such as RIE is applied to the layer structure A to remove the silicon nitride film formed on the upper end surface of the mesa structure. Furthermore, on the upper end surface of the mesa structure (on the surface of the cap layer 18), the n-type Ti/Pt/Au multilayered electrode 30 (not shown) is so formed by evaporation as to cover the whole mesa structure. On the rear surface of the p-type semiconductor substrate 10, for example, an AuZn film is grown by evaporation to form the p-type electrode 32. Thus, the surface-emitting laser device 1 is fabricated.

APPLICABILITY TO INDUSTRY

As described above, according to the present invention, dry etching that provides good accuracy of etching is first applied to the whole layer structure. Thereby, that part of the layer structure which is located on the etching blocking layer is removed by etching to form a general shape of the mesa structure with accuracy. Thereafter, highly selective wet etching is performed to etch the layer structure remaining on the etching blocking layer. Thereby, the portion located over the upper surface of the etching blocking layer is positively etched and formed into the mesa structure with highly accurate dimensions. In addition, the layer structure located under the etching blocking layer, particularly the reflector layer structure, is prevented from being etched. For this reason, the p-type lower reflector layer structure is prevented from being reduced in the cross-sectional area and the resistance of the device is prevented from being increased, thereby preventing an increase in the heat generation and operating voltage of the device. Thus, the reflector layer structure 11 can be made larger in the cross-sectional area to thereby significantly reduce the resistance of the device. In addition, the upper portion over the etching blocking layer is positively etched and formed into the mesa structure. Thus, the current confinement layer is formed in a stable state, making it possible to reduce the threshold of the device.

A surface-emitting laser array according to the present invention is comprised of a plurality of the aforementioned surface-emitting laser devices. These devices are formed on a p-type semiconductor substrate 10 that is common among them. More specifically, a single etching blocking layer 12 is formed on the p-type substrate 10 and serves as a common etching blocking layer for the surface-emitting laser devices.

Furthermore, according to the present invention, even if the whole lower DBR mirror (lower reflector layer structure 11) is formed of AlAs of high thermal conductivity, etching can be stopped at a desired position. For this reason, the present invention can provide a surface-emitting semiconductor laser device with good controllability and a good property of heat saturation.

What is claimed is:

1. A surface-emitting semiconductor laser device comprising a lower reflector layer structure and an upper reflector layer structure, formed on a p-type semiconductor substrate, and an etching blocking layer, a current confinement layer, and an active layer, formed in that order from below between said lower reflector layer structure and said upper reflector layer structure, wherein a portion over said etching blocking layer is formed into a mesa shape.

2. A method for fabricating a surface-emitting semiconductor laser device comprising the steps of:

forming a lower reflector layer structure, an etching blocking layer, a precursor layer of a current confinement layer, and an upper reflector layer structure, on a p-type semiconductor substrate in that order, performing dry etching from the upper reflector layer structure downwards to form a general shape of a mesa structure over the etching blocking layer, performing wet etching up to an upper surface of the etching blocking layer to form a shape of the mesa structure on the upper surface of the etching blocking layer, and oxidizing a side portion of the precursor layer of the current confinement layer included within the mesa structure to form the current confinement layer.

3. A surface-emitting semiconductor laser array comprising a plurality of layer structures each including from said lower reflector layer structure to said upper reflector layer structure according to claim 1, the plurality of layer structures being integrated on a p-type semiconductor substrate that is common among them.

* * * * *